(12) United States Patent
Kurokami et al.

(10) Patent No.: US 12,247,927 B2
(45) Date of Patent: Mar. 11, 2025

(54) METHOD OF EVALUATING SEMICONDUCTOR WAFER

(71) Applicant: SUMCO CORPORATION, Tokyo (JP)

(72) Inventors: Motoi Kurokami, Osaka (JP); Keiichiro Mori, Saga (JP)

(73) Assignee: SUMCO CORPORATION, Tokyo (JP)

( * ) Notice: Subject to any disclaimer, the term of this patent is extended or adjusted under 35 U.S.C. 154(b) by 84 days.

(21) Appl. No.: 17/926,514

(22) PCT Filed: Mar. 3, 2021

(86) PCT No.: PCT/JP2021/008135
§ 371 (c)(1),
(2) Date: Nov. 18, 2022

(87) PCT Pub. No.: WO2021/250949
PCT Pub. Date: Dec. 16, 2021

(65) Prior Publication Data
US 2023/0194438 A1    Jun. 22, 2023

(30) Foreign Application Priority Data
Jun. 8, 2020 (JP) ................. 2020-099230

(51) Int. Cl.
*G01N 21/95* (2006.01)
*G01N 21/88* (2006.01)
*G01N 21/956* (2006.01)

(52) U.S. Cl.
CPC ..... *G01N 21/9501* (2013.01); *G01N 21/8806* (2013.01); *G01N 21/95607* (2013.01);
(Continued)

(58) Field of Classification Search
CPC ........... G01N 21/9501; G01N 21/8806; G01N 21/95607; G01N 2021/8848; G01N 2021/95615
See application file for complete search history.

(56) References Cited

U.S. PATENT DOCUMENTS 9,633,913 B2 * 4/2017 Mori ............... G01N 21/94
10,422,756 B2   9/2019 Mori
(Continued)

FOREIGN PATENT DOCUMENTS

CN   107086184   8/2017
CN   108027330   5/2018
(Continued)

OTHER PUBLICATIONS

U.S. Appl. No. 17/774,761 to Keiichiro Mori et al., filed May 5, 2022.
(Continued)

*Primary Examiner* — Hung V Nguyen
(74) *Attorney, Agent, or Firm* — Greenblum & Bernstein, P.L.C.

(57) ABSTRACT

A method of evaluating a semiconductor wafer by a laser surface inspection device. The method includes performing evaluation of the wafer by detecting a defect kind of one of a deposit and a non-deposited convex defect present on a surface of a coating layer as a light point defect based on a plurality of measurement results including three kinds of low incidence angle measurement results obtained by, on the surface of the coating layer, reception of a radiated light radiated by reflection or scattering of a light incident from a first incident system at the surface by three kinds of light receiving systems, and at least one high incidence angle measurement result obtained by reception of a radiated light radiated by reflection or scattering of a light incident from a second incident system at the surface by at least one of the three kinds of light receiving systems.

4 Claims, 3 Drawing Sheets

(52) U.S. Cl.
CPC .......... *G01N 2021/8848* (2013.01); *G01N 2021/95615* (2013.01)

(56) References Cited

U.S. PATENT DOCUMENTS

| | | | |
|---|---|---|---|
| 10,718,720 B2 * | 7/2020 | Mori | .................. G01N 21/956 |
| 2001/0030296 A1 | 10/2001 | Ishimaru et al. | |
| 2002/0041374 A1 | 4/2002 | Ohshima et al. | |
| 2012/0307041 A1 | 12/2012 | Fujiwara et al. | |
| 2013/0265577 A1 | 10/2013 | Peng et al. | |
| 2016/0307810 A1 | 10/2016 | Mori | |
| 2018/0292330 A1 | 10/2018 | Mori | |
| 2019/0279890 A1 | 9/2019 | Mori | |
| 2019/0331609 A1 | 10/2019 | Mori | |

FOREIGN PATENT DOCUMENTS

| | | | |
|---|---|---|---|
| CN | 110132996 | | 8/2019 |
| JP | 2000-162141 A | | 6/2000 |
| JP | 2001-255278 A | | 9/2001 |
| JP | 2002-116155 A | | 4/2002 |
| JP | 2005-43277 A | | 2/2005 |
| JP | 2010-129748 A | | 6/2010 |
| JP | 2012-68103 A | | 4/2012 |
| JP | 2013-238534 | | 11/2013 |
| JP | 2015-516574 A | | 6/2015 |
| JP | 2016-200554 A | | 12/2016 |
| JP | 2017-62157 A | | 3/2017 |
| JP | 2017-72461 A | | 4/2017 |
| JP | 2017-142209 A | | 8/2017 |
| JP | 2019-54132 A | | 4/2019 |
| KR | 2011000583 A * | 1/2011 | ......... G01N 21/9501 |
| TW | I470216 B | | 1/2015 |
| TW | I477769 B | | 3/2015 |
| WO | 2013/155008 A1 | | 10/2013 |
| WO | 2018/193762 A1 | | 10/2018 |

OTHER PUBLICATIONS

International Search Report issued in International Bureau of WIPO Patent Application No. PCT/JP2021/008135, dated Apr. 27, 2021, along with an English translation thereof.

Office Action issued in Taiwanese Counterpart Patent Appl. No. 11021188470, dated Dec. 2, 2021.

Examination Report issued in Taiwanese Counterpart Patent Appl. No. 11120342540, dated Apr. 8, 2022, along with an English translation thereof.

Office Action issued in Corresponding JP Patent Application No. 2020-099230, dated Feb. 7, 2023, along with an English translation thereof.

International Preliminary Report on Patentability Issued in International Bureau of WIPO Patent Application No. PCT/JP2021/008135, dated Dec. 22, 2022, along with an English translation thereof.

Office Action issued in Corresponding KR Patent Application No. 10-2022-7039981, dated Sep. 24, 2024, along with an English translation thereof.

Office Action issued in Corresponding CN Patent Application No. 202180037081.0, dated Dec. 28, 2024, along with an English translation thereof.

Xue, New Application Research of Dark Fiend Scattering Technology in Wafer Surface Defect Detection (2009), along with partial translation.

* cited by examiner (a)

(b)

METHOD OF EVALUATING SEMICONDUCTOR WAFER

CROSS REFERENCE TO RELATED APPLICATIONS

The present application claims priority from Japanese Patent Application No. 2020-099230, filed on Jun. 8, 2020, which is expressly incorporated herein by reference in its entirety.

TECHNICAL FIELD

The present invention relates to a method of evaluating a semiconductor wafer. More particularly, it relates to a method of evaluating a semiconductor wafer having a coating layer on a semiconductor substrate.

BACKGROUND ART

In recent years, as the method of evaluating the defects of a semiconductor wafer or foreign matters deposited on the surface thereof, there has been widely used a method based on the LPD (Light Point Defect) to be detected by a laser surface inspection device (for example, see Japanese Patent Application Publication No. 2005-43277, which is expressly incorporated herein by reference in its entirety). With this method, by making a light incident upon the surface of the semiconductor wafer to be evaluated, and detecting the radiated light (a scattered light or a reflected light) from this surface, the presence or absence and the size of the defects/foreign matters of the semiconductor wafer are evaluated.

SUMMARY OF INVENTION

Japanese Patent Application Publication No. 2005-43277 discloses a method of evaluating a semiconductor wafer with a film deposited thereon by establishing a classification into convex defects and concave defects using a laser surface inspection device including one incident system and two light receiving systems (the second embodiment described in paragraphs 0024 to 0026 of Japanese Patent Application Publication No. 2005-43277).

On the semiconductor wafer after deposition of the coating layer thereon, deposits and non-deposited convex defects on the surface of the coating layer can be present as surface defects. The deposits are foreign matters deposited on the coating layer from external environment during the deposition process and/or after the deposition process. In contrast, the non-deposited convex defect is the local bulge of the coating layer surface, and is generally a defect resulting from swelling due to deposition of the defect present on the wafer surface before deposition serving as the core. The deposit is removable by washing, and hence scarcely affects the subsequent processes. In contrast, the non-deposited convex defect can cause, for example, an abnormal operation in the subsequent wiring process, which may cause the reduction of the yield, but cannot be removed by washing. As described above, the deposit and the non-deposited convex defect are different in terms of measures for reduction, and hence desirably, both can be detected, respectively.

One aspect of the present invention provides for a novel method of evaluating a semiconductor wafer having a coating layer thereon by detecting the deposit and/or the non-deposited convex defect on the surface of the coating layer.

One aspect of the present invention relates to, a method of evaluating a semiconductor wafer (which will be hereinafter also described simply as a "wafer") by a laser surface inspection device, wherein the semiconductor wafer has a coating layer on a semiconductor substrate, the laser surface inspection device has, a first incident system, a second incident system making a light incident upon a surface to be irradiated at an incidence angle higher than an incidence angle of a light to be made incident upon the surface to be irradiated by the first incident system, a first light receiving system, a second light receiving system, and a third light receiving system, the above three kinds of light receiving systems are different in one or more selected from the group consisting of a light-receiving angle at which a light radiated from the surface to be irradiated is received and polarization selectivity, respectively, the method includes performing evaluation of the semiconductor wafer by detecting a defect kind selected from the group consisting of a deposit and a non-deposited convex defect present on a surface of the coating layer as a light point defect based on a plurality of measurement results including three kinds of low incidence angle measurement results obtained by, on the surface of the coating layer, reception of a radiated light radiated by reflection or scattering of a light incident from the first incident system at the surface by the three kinds of light receiving systems, and at least one high incidence angle measurement result obtained by reception of a radiated light radiated by reflection or scattering of a light incident from the second incident system at the surface by at least one of the three kinds of light receiving systems (which will be hereinafter also described as simply an "evaluation method").

In one embodiment, one kind of the light receiving system among the above three kinds of light receiving systems can receive an omnidirectional light, and the other two kinds of light receiving systems can selectively receive polarized lights different in azimuth angle, respectively.

In one embodiment, the light-receiving angle of the light receiving system receiving the omnidirectional light can be a higher angle than the light-receiving angles of the other two kinds of light receiving systems.

In one embodiment, it can be that $0°≤θ_1°≤90°$, and $90°≤θ_2° 180°$ where $θ_1°$ represents the azimuth angle of the polarized light selectively received by one of the other two kinds of light receiving systems, and $θ_2°$ represents the azimuth angle of the polarized light selectively received by the other.

In one embodiment, the at least one high incidence angle measurement result can include the measurement result obtained by reception of the radiated light radiated by reflection or scattering of the light incident from the second incident system at the surface by at least one of the other two kinds of light receiving systems.

In one embodiment, the above evaluation method can include distinguishing whether the defect kind detected as the light point defect is a deposit or a non-deposited convex defect based on the distinguishing criterion selected from the group consisting of, the presence or absence of detection and the detection size in the measurement result 1 obtained by the combination of the first incident system and the first light receiving system, the presence or absence of detection and the detection size in the measurement result 2 obtained by the combination of the first incident system and the second light receiving system, the presence or absence of detection and the detection size in the measurement result 3 obtained by the combination of the first incident system and the third light receiving system, and the presence or absence of detection and the detection size in the measurement result 4 obtained by the combination of the second incident system and the second light receiving system or the third light receiving system, wherein the first light receiving system receives an omnidirectional light, the second light receiving system selectively receives a polarized light at an azimuth angle $\theta_1°$, the third light receiving system selectively receives a polarized light at an azimuth angle $\theta_2°$ different from the azimuth angle $\theta_1°$, where $0°\leq\theta_1°\leq90°$ and $90°\leq\theta_2°\leq180°$, and the light-receiving angle of the first light receiving system is a higher angle than the light-receiving angle of the second light receiving system and the light-receiving angle of the third light receiving system.

In one embodiment, the distinguishing can be performed according to the distinguishing criteria shown in Table 1 described later.

In one embodiment, in Table 1, X can fall within the range of 1.30 to 1.50.

In one embodiment, in Table 1, Y can fall within the range of 0.60 to 0.80.

In one embodiment, in Table 1, Z can fall within the range of 0.80 to 0.85.

In one embodiment, the above coating layer can be a deposition layer including deposition materials deposited therein.

In one embodiment, the above semiconductor substrate can be a single crystal silicon substrate.

In accordance with one aspect of the present invention, by detecting the deposit and/or the non-deposited convex defect on the coating layer surface, it is possible to evaluate a semiconductor wafer having a coating layer on a semiconductor substrate.

DESCRIPTION OF EMBODIMENTS

Below, the above evaluation method will be further described in detail.

[Semiconductor Wafer to be Evaluated]

The semiconductor wafer to be evaluated in the above evaluation method is a semiconductor wafer having a coating layer on a semiconductor substrate. The above semiconductor substrate can be various semiconductor substrates such as a single crystal silicon substrate.

The coating layer present on the above semiconductor substrate can be various coating layers formed by a known deposition method. Specific examples of the coating layer may include an oxide layer, a nitride layer, a polysilicon layer, an amorphous layer, and a metal layer.

In one embodiment, the above coating layer can be a deposition layer including deposition materials deposited on the semiconductor substrate. As the deposition methods for forming the deposition layer, mention may be made of various deposition methods capable of depositing a deposition material on a semiconductor substrate by a gas phase growth method, for example, a CVD (Chemical Vapor Deposition) method, or an ALD (Atomic Layer Deposition) method. The thickness of the above coating layer can fall within the range of, for example, 5 to 500 nm, but is not limited to this range.

On the surface of the coating layer on the semiconductor substrate as described above, a deposit and a non-deposited convex defect can be present. According to the above evaluation method described in detail below, these defect kinds can be detected. Further, the deposit and the non-deposited convex defect are both present each in a convex shape on the coating layer surface, and generally both are present on the coating layer surface with a wide size distribution. For this reason, it is difficult to distinguish between both with the evaluation based on the size of the light point defect simply detected by a laser surface inspection device. In contrast, with the above evaluation method described in detail below, it becomes possible to distinguish between the deposit and the non-deposited convex defect.

[Laser Surface Inspection Device]

Figure 1:
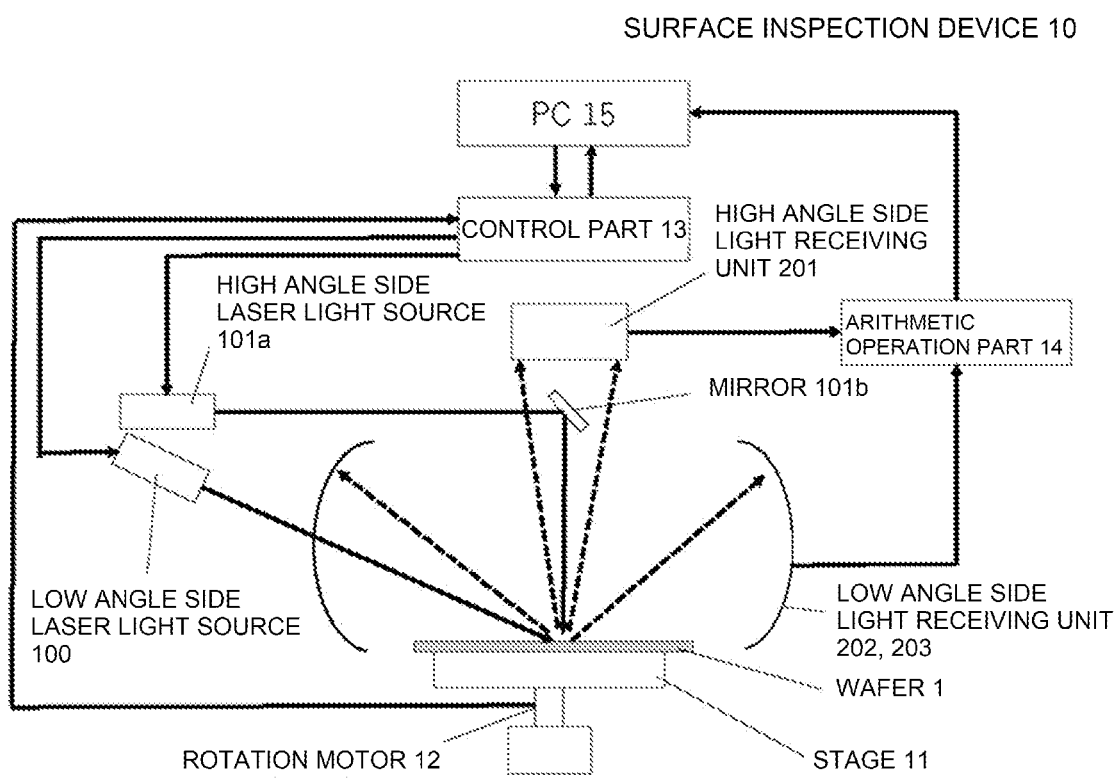
FIG. 1 shows one example (schematic block view) of a laser surface inspection device.

The laser surface inspection device (which will be hereinafter also described simply as the "surface inspection device") for use in the above evaluation method includes two kinds of incident systems different in incidence angle of a light to be made incident upon a surface to be irradiated, and three kinds of light receiving systems (a first light receiving system, a second light receiving system, and a third light receiving system) respectively different in at least one selected from the group consisting of the light-receiving angle and the polarization selectivity. With such a surface inspection device, the radiated lights radiated by reflection or scattering of a light incident upon the surface (i.e., the surface to be irradiated) of the coating layer of the semiconductor wafer to be evaluated from different incident systems at respective sites on the surface to be irradiated are received by different light receiving systems. The direction of radiation of the radiated light (in more detail, the reflection angle of the reflected light or the scattering angle of the scattered light) and the polarization characteristic can vary variously due to the presence of the deposit and the non-deposited convex defect at the coating layer formed on the semiconductor substrate. The present inventors presume as follows: various radiated lights different in these are received by the three kinds of light receiving systems respectively different in at least one selected from the group consisting of the light-receiving angle and the polarization selectivity; this enables detection of the deposit and the non-deposited convex defect as light point defects. One example (schematic block view) of the surface inspection device including such incident systems and light receiving systems is shown in FIG. 1. In FIG. 1, the incident light is schematically indicated with a solid line arrow; and the radiated light, with a dotted line arrow. However, the incidence direction and the radiation direction shown in the drawing are illustrative, and do not restrict the present invention at all. Further, the radiated light received by each light receiving system can include one or both of the reflected light and the scattered light.

A surface inspection device 10 shown in FIG. 1 includes a low angle side laser light source 100 as the first incident system. The second incident system making a light incident upon the surface to be irradiated at an incidence angle higher than the incidence angle of the light to be made incident upon the surface to be irradiated by the first incident system includes a high angle side laser light source 101a and a mirror 101b. The light emitted from the high angle side laser light source 101a is reflected by the mirror 101b, thereby to be changed in emission direction, and is made incident upon the surface of the coating layer (not shown) of the wafer 1.

The surface inspection device 10 shown in FIG. 1 includes a high angle side light receiving unit 201, a low angle side light receiving unit 202, and a low angle side light receiving unit 203 as the three kinds of light receiving systems. The surface inspection device 10 shown in FIG. 1 has a configuration of one high angle side light receiving unit, and two low angle side light receiving units. However, the surface inspection device for use in the above evaluation method is not limited to such a configuration. The configuration of two high angle side light receiving units and one low angle side light receiving unit is also acceptable. Further, the light-receiving angles of the two low angle side light receiving units may be the same or different. This point also applies to the case of two high angle side light receiving units. The three light receiving units are respectively different in at least one selected from the group consisting of the light-receiving angle and the polarization selectivity. This point will be further described later. For the surface inspection device 10 shown in FIG. 1, the low angle side light receiving units 202 and 203 each have a configuration in which a radiated light is received over the entire circumference of a stage 11. However, the light receiving unit included in the surface inspection device may only have a configuration capable of receiving a radiated light, and is not limited to the one with the configuration shown in FIG. 1.

Further, the surface inspection device 10 includes a rotation motor 12 making the stage 11 for mounting the wafer 1 thereon rotatable, and a movable means (not shown) enabling the movement thereof in the horizontal direction, and thereby can change the irradiation position of the light to be made incident from the each laser light source. As a result of this, it becomes possible to sequentially irradiate (i.e., scan) the region to be evaluated of the surface of the coating layer of the wafer 1 or the entire surface region thereof with a light, and to perform detection of the defect kind in the region to be evaluated or the entire surface region.

Further, the surface inspection device 10 includes a control part 13 controlling the rotation and the movement in the horizontal direction of the stage 11, and an arithmetic operation part 14 calculating the detection size of the defect kind detected based on the information of the radiated light received by the each light receiving unit. Further, a PC (Personal Computer) 15 receives the position information of the position at which a light is radiated from the control part 13, and sends a signal for moving the stage 11 in order to irradiate the unirradiated position with a light. Further, the PC 15 receives the information regarding the detection size of the detected defect kind from the arithmetic operation part 14, and can generate various measurement results described in detail later.

However, the configuration of the surface inspection device schematically shown in FIG. 1 is illustrative. With the above evaluation method, the surface inspection device is not limited to the surface defect device with the configuration shown in FIG. 1, and various surface inspection devices can be used so long as the device is a surface inspection device having two kinds of incident systems different in incidence angle of the light to be made incident upon the surface to be irradiated, and three kinds of light receiving systems respectively different in at least one selected from the group consisting of the light-receiving angle and the polarization selectivity (the first light receiving system, the second light receiving system, and the third light receiving system). Examples of the specific device name may include Surfscan series SP5 and the same series SP7 manufactured by KLA Co.

[Defect Kind to be Detected]

The detection target by the surface inspection device with the above evaluation method is the defect kind selected from the group consisting of the deposit and the non-deposited convex defect present on the surface of the coating layer formed on the semiconductor substrate in a semiconductor wafer. The defect kind is detected as a light point defect at the light receiving system in the following manner: lights are made incident on the surface of the coating layer of the wafer to be evaluated from the two kinds of incident systems, respectively, so that the lights are radiated (scattered or reflected) from the surface of the coating layer, resulting in detection of a light point defect. By detecting the light point defect, it is possible to calculate the size (detected size) of the defect kind which has caused the light point defect based on the size of the standard particle from the size of the detected light point defect at the arithmetic operation part of the surface inspection device. Calculation of the detection size based on the size of the standard particle can be performed by the arithmetic operation means included in a commercially available surface inspection device, or by a known arithmetic operation method.

The deposit is the foreign matter deposited on the surface of the coating layer from external environment during the deposition process and/or after the deposition process for forming the coating layer on the semiconductor substrate.

In contrast, the non-deposited convex defect is local bulge of the coating layer surface as distinct from the defect caused by the deposition as described above. Such a non-deposited convex defect is generally a defect enlarged due to the deposition with the defect present on the wafer surface before deposition serving as the core.

With the above evaluation method, on the surface of the coating layer of the wafer, the defect kind selected from the group consisting of a deposit and a non-deposited convex defect present on the surface of the coating layer of the wafer is detected as a light point defect based on a plurality of measurement results including three kinds of low incidence angle measurement results obtained by reception of a radiated light radiated by reflection or scattering of a light incident from the first incident system (i.e., the low angle side incidence system) on the surface by the above three kinds of light receiving systems, respectively, and at least one kind of high incidence angle measurement result obtained by reception of a radiated light radiated by reflection or scattering of a light incident from the second incident system (i.e., the high angle side incidence system) at the surface by at least one of the above three kinds of light receiving systems. The present inventors consider as follows: the deposit and the non-deposited convex defect are different from each other in property of reflecting or scattering the incident light from the above two incident systems for radiation, for this reason, by using the plurality of measurement results as described above, it becomes possible to distinguish between the deposit and the non-deposited convex defect, and to detect them as light point defects.

Specific Embodiment of Evaluation Method

Then, a specific embodiment of the above evaluation method will be described.
<Incident System>
The wavelengths of the incident lights respectively incident upon the coating layer surface of the wafer from the first incident system and the second incident system have no particular restriction. Although the incident light can be an ultraviolet light in one embodiment, it may be a visible light or other lights. Herein, the ultraviolet light in the present invention and the present description represents a light with a wavelength within the region of less than 400 nm, and the visible light represents a light with a wavelength within the region of 400 to 600 nm.

As for the above two kinds of incident systems, the high angle (side)/low angle (side) with respect to the incidence angle are determined relatively by the relationship of one and the other, and the specific angle is not restricted. In one embodiment, the incidence angle of the incident light incident upon the coating layer surface of the wafer to be evaluated from the first incident system (i.e., the low angle side incident system) can be 0° or more and 60° or less, and preferably falls within the range of more than 0° and 30° or less when the incidence angle is specified to be from 0° at minimum to 90° at maximum with all the directions in parallel with the coating layer surface as 0°, and the direction perpendicular to the coating layer surface as 90°. On the other hand, the incidence angle of the incident light incident upon the coating layer surface of the wafer to be evaluated from the second incident system (i.e., the high angle side incident system) can be more than 60° and 90° or less, and is preferably more than 80° and 90° or less as the incidence angle specified as described above.
<Light Receiving System>
The surface inspection device for use in the above evaluation method has three kinds of light receiving systems, and the three kinds of light receiving systems are respectively different in at least one selected from the group consisting of the light-receiving angle and the polarization selectivity. In one embodiment, one kind of light receiving system can be the high angle side light receiving system receiving the radiated light from the surface of the coating layer of the wafer to be evaluated on the high angle side, and the other two kinds of light receiving systems can be the low angle side light receiving systems receiving the radiated light on the low angle side. The light-receiving angles of the two kinds of low angle side light receiving systems may be the same or different. Herein, the high angle (side)/low angle (side) with respect to the incidence angle are determined relatively by the relationship of one and the other, and the specific angle is not restricted. In one embodiment, when the angle is specified with reference to the surface of the coating layer of the wafer to be evaluated as with the incidence angle described previously, the light reception on the high angle side can represent the light reception at an light-receiving angle of more than 80° and 90° or less, and the light reception on the low angle side can represent the light reception at an light-receiving angle of 0° or more and 80° or less. Further, in another embodiment, two kinds of light receiving systems may be the high angle side light receiving systems, and one kind of light receiving system may be the low angle side light receiving system. In this case, the light-receiving angles of the two kinds of high angle side light receiving systems may be the same or different.

The above three kinds of light receiving systems are respectively different in at least one selected from the group consisting of the light-receiving angle and the polarization selectivity. The above description applies to the light-receiving angle. On the other hand, "different in polarization selectivity" represents "different in at least one of the property of the light receiving system to select and receive a polarized light (i.e., to have polarization selectivity), the property to receive an omnidirectional light (i.e., to have no polarization selectivity), and the property to selectively receive a polarized light having a specific (or a specific range of) azimuth angle of the polarized lights". The means for imparting the light receiving system with polarization selectivity is known. For example, provision of a polarizing filter in the light receiving system can configure a light receiving system having polarization selectivity, and can impart the property to selectively receive a polarized light having a specific (or a specific range of) azimuth angle according to the kind of the polarizing filter to the light receiving system.

For the above surface inspection device, in one embodiment, one kind of light receiving system can receive an omnidirectional light, and the other two kinds of light receiving systems can selectively receive a polarized light. Further, in a specific one embodiment, one kind of light receiving system can receive an omnidirectional light, and the other two kinds of light receiving systems can selectively receive polarized lights different in azimuth angle, respectively. For the two kinds of light receiving systems for selectively receiving a polarized light, it can be that $0°≤θ_1°≤90°$ and that $90°≤θ_2°≤180°$ where $θ_1°$ represents the azimuth angle of the polarized light received by one light receiving system, and $θ_2°$ represents the azimuth angle of the polarized light received by the other light receiving system. Further, in a preferable specific one embodiment, the light-receiving angle of the light receiving system receiving an omnidirectional azimuth angle light can be a higher angle than that of the light receiving system selectively receiving a polarized light. The omnidirectional light is also referred to as a nonpolarized light, and is a light which is not a polarized light. In contrast, the polarized light is a light having a specific directivity (azimuth angle).

As for the light receiving system, a more preferable specific one embodiment is as follows.

The first light receiving system receives an omnidirectional light.

The second light receiving system receives a polarized light with an azimuth angle $θ_1°$.

The third light receiving system receives a polarized light with an azimuth angle $θ_2°$.

The light-receiving angle of the first light receiving system is a higher angle than the light-receiving angles of the second light receiving system and the third light receiving system. That is, the first light receiving system receiving an omnidirectional azimuth angle light is a high angle side light receiving system, and the second light receiving system and the third light receiving system receiving a polarized light are each a low angle side light receiving system. Further, the azimuth angle of the polarized light received by the two light receiving systems (the second light receiving system and the third light receiving system) receiving a polarized light satisfies $\theta_1° < \theta_2\theta$.

For the surface inspection device having the light receiving system in accordance with the more preferable specific one embodiment described above, the second light receiving system receiving a polarized light with a smaller azimuth angle can suppress the reflected light component from the surface of the coating layer of the wafer, and conceivably tends to detect the scattered light from the defect kind causing isotropic scattering. In contrast, the present inventors consider as follows: although the third light receiving system receiving a polarized light with a larger azimuth angle may produce a lower effect of suppressing the reflected light component from the surface of the coating layer of the wafer as compared with the second light receiving system, it can detect the scattered light from the defect kind causing anisotropic scattering with a high sensitivity. Further, the present inventors presume as follows: the first light receiving system receiving an omnidirectional light on the higher angle side than those of the second light receiving system and the third light receiving system is combined with the above two kinds of light receiving systems, as a result, the detection sensitivity for various defect kinds can be more enhanced. The present inventors consider that it thus becomes possible to detect both the deposit and the non-deposited convex defect with a high sensitivity. However, the above description includes the presumption by the present inventors, and does not restrict the present invention at all.

With the above evaluation method, the defect kind selected from the group consisting of a deposit and a non-deposited convex defect present on the surface of the coating layer of a wafer is detected as a light point defect based on a plurality of measurement results including three kinds of low incidence angle measurement results obtained by reception of a radiated light radiated by reflection or scattering of a light incident from the first incident system (i.e., the low angle side incidence system) at the surface of the coating layer of the wafer to be evaluated by the above three kinds of light receiving systems, respectively, and at least one high incidence angle measurement result obtained by reception of a radiated light radiated by reflection or scattering of a light incident from the second incident system (i.e., the high angle side incidence system) at the surface of the coating layer by at least one kind of the above three kinds of light receiving systems. From the viewpoint of further enhancing the detection sensitivity of the deposit and/or the non-deposited convex defect, the above high incidence angle measurement result preferably includes the measurement result obtained by reception of the radiated light radiated by reflection or scattering of a light incident from the second incident system at the surface of the coating layer of the wafer to be evaluated by at least one of the above two kinds of light receiving systems capable of selectively receiving a polarized light. In one embodiment, the high incidence angle measurement result can be the measurement result obtained by reception of the radiated light radiated by reflection or scattering of a light incident from the second incident system at the surface of the coating layer of the wafer to be evaluated by any one of the above two kinds of light receiving systems capable of selectively receiving a polarized light.

By the way, as described previously, the deposit and the non-deposited convex defect have respectively different causes of occurrence. For this reason, the means for reducing them are also different. For example, the deposit can be removed with ease by general washing. Therefore, the deposit can be reduced, for example, only by strengthening the washing conditions. Specifically, as the means for reducing the deposit, mention may be made of an increase in washing frequency, an increase in washing time, use of a detergent with a higher detergency, and the like. Alternatively, suppression of the deposition of foreign matters on the surface of the coating layer during the deposition process and/or after the deposition process by revision of the deposition process may be referred to as one example of the means for reducing the deposit. On the other hand, the non-deposited convex defect cannot be removed by washing after the formation of the coating layer. For this reason, as the means for reducing the non-deposited convex defect, mention may be made of the revision of the manufacturing process of a semiconductor wafer, for example, strengthening the conditions of washing of the semiconductor substrate to be performed before the deposition process of the coating layer, and removal of the foreign matters on the semiconductor substrate surface which can become the core for forming the non-deposited convex defect by washing. Therefore, in evaluation of a wafer having a coating layer, the deposit and the non-deposited convex defect desirably can be distinguished and detected. Distinguishing and detection thereof enables grasp of respective numbers of occurred deposits and non-deposited convex defects, and the presence statuses (distributions) thereof, which enables selection of a proper reducing means according to the numbers of occurrences and distributions thereof.

Regarding the foregoing point, with the light receiving system including two kinds of incident systems different in incidence angle and the light receiving systems in accordance with the more preferable specific one embodiment described above, whether the defect kind detected as a light point defect at the surface inspection device is a deposit or a non-deposited convex defect can be distinguished based on at least one kind of distinguishing criterion selected from the group consisting of, the presence or absence of detection and the detection size in the measurement result 1 obtained by the combination of the first incident system and the first light receiving system, the presence or absence of detection and the detection size in the measurement result 2 obtained by the combination of the first incident system and the second light receiving system, the presence or absence of detection and the detection size in the measurement result 3 obtained by the combination of the first incident system and the third light receiving system, and the presence or absence of detection and the detection size in the measurement result 4 obtained by the combination of the second incident system and the second light receiving system or the third light receiving system. The present inventors consider the reason why such distinguishing becomes possible as follows: the deposit and the non-deposited convex defect present on the surface of the coating layer of the wafer are different in shape and the like due to the difference in cause of occurrence, and thereby are different in behavior of scattering/reflecting a light for this reason, the different in incidence angle of the light incident upon the surface of the coating layer of the wafer, and the difference in the light-receiving angle and the polarization selectivity of the light receiving system result in a difference in presence or absence of detection and the detection size at the light receiving system.

With the surface inspection device including two kinds of incident systems having different incidence angles, and the light receiving system in accordance with the more preferable specific one embodiment described above, further preferably, whether the detected defect kind is a deposit or a non-deposited convex defect can be distinguished with more precision according to the criteria shown in Table 1 below.

process change and maintenance for suppressing the occurrence of the defect kinds (deposits and/or non-deposited convex defects) on the surface of the coating layer (for example, the change in manufacturing conditions, exchange of the manufacturing device, washing, and the improvement of the quality of the chemical) can be performed. As a result, subsequently, it becomes possible to provide a high-quality semiconductor wafer less in the defect kinds as a product wafer.

TABLE 1

| Distinguishing criteria | Defect kind |
| --- | --- |
| (1) Exceeding the detection upper limit size in at least one of measurement result 1, measurement result 2, and measurement result 3. | Deposit |
| (2) Other than the light point defect distinguished in terms of defect kind in the (1), detected in the measurement result 2, and not detected in the measurement result 3. | Deposit |
| (3) Other than the light point defect distinguished in terms of defect kind in the (1) or the (2), detected in the measurement result 3, and not detected in the measurement result 2. | Non-deposited convex defect |
| (4) Other than the light point defect distinguished in terms of defect kind in any of the (1) to (3), detected in the measurement result 2, and not detected in the measurement result 1. | Deposit |
| (5) Other than the light point defect distinguished in terms of defect kind in any of the (1) to (4), the detection size in the measurement result 4 and the detection size in the measurement result 2 being both more than 0, and the detection size ratio satisfying any of (detection size in measurement result 2)/(detection size in measurement result 4) ≥ X, and (detection size in measurement result 2)/(measured size in measurement result 4) ≤ Y. | Non-deposited convex defect |
| (6) Other than the light point defect distinguished in terms of defect kind in any of the (1) to (4), the detection size in the measurement result 4 and the detection size in the measurement result 2 both being more than 0, and the detection size ratio satisfying Y < (detection size in measurement result 2)/(detection size in measurement result 4) < X. | Deposit |
| (7) Other than the light point defect distinguished in terms of defect kind in any of the (1) to (6), the detection size in the measurement result 2 and the detection size in the measurement result 3 both being more than 0, and the size ratio of detection size in measurement result 2 and detection size in measurement result 3 satisfying (detection size in measurement result 2)/(detection size in measurement result 3) > Z. | Non-deposited convex defect |
| (8) Other than the light point defects distinguished in terms of defect kind in the (1) to (7). | Deposit |

In Table 1, X, Y, and Z are each independently more than 0. In one embodiment, X can fall within the range of 1.30 to 1.50, Y can fall within the range of 0.60 to 0.80, and Z can fall within the range of 0.80 to 0.85.

The detection upper limit size in the (1) is determined according to the surface inspection device to be used for the evaluation. For example, for the detection size at the surface inspection device, the detection upper limit size of the measurement result 1 can be 300 nm or more, the detection upper limit size of the measurement result 2 can be 100 nm or more, and the detection upper limit size of the measurement result 3 can be 200 nm or more.

A further specific one embodiment of the above evaluation method will be described later by way of Examples. With the evaluation by the above evaluation method, it is possible to perform various evaluations regarding the defect kind such as the presence or absence of the defect kinds (deposits and/or non-deposited convex defects) on the surface of the coating layer formed on the semiconductor substrate of a semiconductor wafer, and the number and the position (distribution) of the occurred defect kinds.

Based on the evaluation results obtained by performing the evaluation by the evaluation method described above, in the manufacturing process of a semiconductor wafer, the Further, the semiconductor wafer before shipment as a product can be evaluated with the above evaluation method, and the semiconductor wafer with the number of the occurred defect kinds on the surface of the coating layer confirmed to fall within the previously determined allowable range (the threshold value or less) can be shipped as a product wafer. As a result, it becomes possible to supply a high-quality semiconductor wafer with stability. The threshold value has no particular restriction, and can be appropriately set according to the use of the product wafer, and the like.

That is, the above evaluation method can be used for the process control and the quality control of a semiconductor wafer having a coating layer on a semiconductor substrate.

EXAMPLES

Below, the present invention will be further described by way of Examples. However, the present invention is not limited to the embodiments shown in Examples.

1. Detection of Light Point Defect (LPD) and Size Calculation of Defect Kind

As semiconductor wafers to be evaluated, there were prepared three semiconductor wafers each having a nitride layer (silicon nitride layer) formed on a single crystal silicon substrate with a CVD method. The thicknesses of the three semiconductor wafers were 10 nm, 50 nm, and 100 nm, respectively.

On each surface of the nitride layers of the three semiconductor wafers, using a Surfscan series SP7 manufactured by KLA Co., as a surface inspection device, light point defects were detected.

The Surfscan series SP7 manufactured by KLA Co., has, as an incident system,
an oblique laser light source (ultraviolet light source) making an incident light obliquely incident upon the surface of the coating layer of a wafer to be evaluated, and
a perpendicular laser light source (ultraviolet light source) making an incident light incident perpendicularly upon the surface of the coating layer of a wafer to be evaluated via a mirror.

The above surface inspection device has, as a combination of the incident system and the light receiving system,
a DW1O (Dark-Field Wide 1 Oblique) channel,
a DW2O (Dark-Field Wide 2 Oblique) channel,
a DNO (Dark-Field Narrow Oblique) channel,
a DWN (Dark-Field Wide Normal) channel, and
a DNN (Dark-Field Narrow Normal) channel.

In the present evaluation, the DNN channel was not used.

The light receiving units of the DW1O channel and the DW2O channel are each a light receiving unit on the lower angle side relative to the light receiving unit of the DNO channel, and each have polarization selectivity. The azimuth angle of the polarized light received by the DW1O channel is smaller than the azimuth angle of the polarized light received by the DW2O channel. The azimuth angle of the polarized light received by the DW1O channel falls within the range of 0° or more and 90° or less, and the azimuth angle of the polarized light received by the DW2O channel falls within the range of 90° or more and 180° or less. The detection results of the DW1O channel correspond to the "measurement result 2" in Table 1. The detection results of the DW2O channel corresponds to the "measurement result 3" in Table 1.

The light receiving unit of the DWN channel is common with the light receiving unit of the DW1O channel. The detection results of the DWN channel correspond to the "measurement result 4" in Table 1.

The light receiving unit of the DNO channel is a light receiving unit receiving an omnidirectional light (i.e., not having polarization selectivity), and is a light receiving unit on the higher angle side relative to those of the light receiving units of the DW1O channel and the DW2O channel. The detection results of the DNO channel correspond to the "measurement result 1" in Table 1.

Using the above surface inspection device, for the above three semiconductor wafers, an incident light was scanned over the entire region of the surface of each nitride layer, and the defect kinds were detected as light point defects (LPDs), and the detected defect kind size (detection size) was calculated at the arithmetic operation part provided in the above surface inspection device based on the size of each light point defect. The lower limits of the sizes (detection lower limit sizes) of the light point defects to be detected in respective light receiving systems of the surface inspection device is 40 nm for the DNO channel, 20 nm for the DW1O channel, 30 nm for the DW2O channel, and 50 nm for the DWN channel.

Further, with the above surface inspection device, as the detection results of the DCO (Dark-Field Composite Oblique) channel, the results of the total sum of the detection results of the DW1O channel, the DW2O channel, and the DNO channel can be obtained. At the DCO channel, when light point defects are detected at the same position at two or more channels of the DW1O channel, the DW2O channel and the DNO channel, a larger size is adopted as the size of the light point defect. Further, at the DCO channel, when the size is displayed as "200,000 µm", the "200,000 µm" is only a value displayed for convenience, and means that the detection size exceeds the detection upper limit size in at least one of the DW1O channel, the DW2O channel and the DNO channel. The detection upper limit size of the DW1O channel is 100 nm, the detection upper limit size of the DW2O channel is 200 nm, and the detection upper limit size of the DNO channel is 300 nm.

2. Observation of Defect Kind by Scanning Electron Microscope

Figure 2:
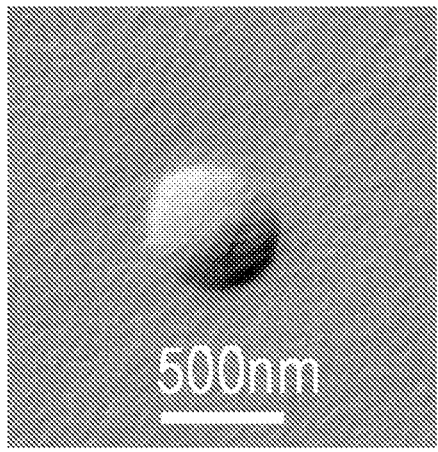
FIG. 2 shows one example (SEM image) of the non-deposited convex defect and the deposit observed by a SEM at the surface of the coating layer of a semiconductor wafer in Example.
Figure 2:
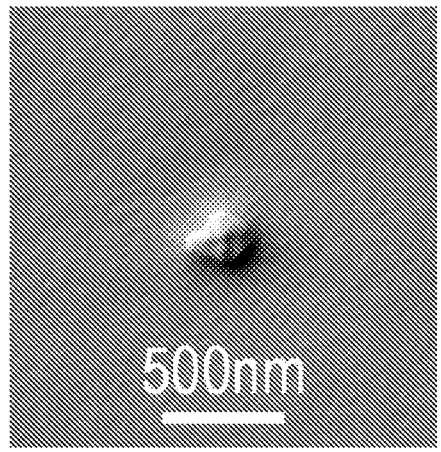

The surface of the nitride layer of the semiconductor wafer evaluated in the 1. was observed by a SEM (Scanning Electron Microscope). The defect kinds present at the light point defect positions detected by the above surface inspection device were classified into the deposits and the non-deposited convex defects based on the observation results. One example (SEM image) of each defect kind observed with a SEM is shown in FIG. 2. FIG. 2(a) is the SEM image of the defect kind classified as a non-deposited convex defect, and FIG. 2(b) is the SEM image of that classified as a deposit.

3. Distinguishing of Defect Kind

Based on the detection results of the 1., the detected light point defects were classified into the deposits or the non-deposited convex defects according to the algorithm of Table 2 shown below in accordance with the Table 1 shown previously.

Figure 3:
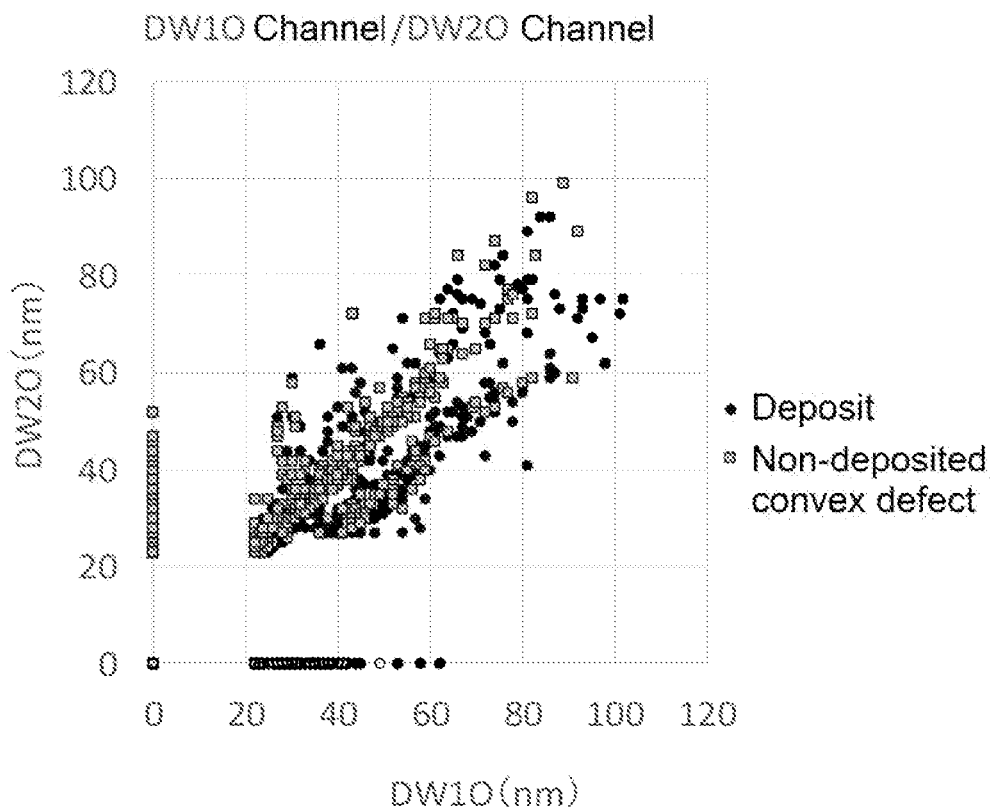
FIG. 3 is a graph showing the detection size distribution of the DW1O channel and the DW2O channel used in distinguishing of (2) and (3) shown in Table 2 in Example.

FIG. 3 is a graph showing the detection size distribution of the DW1O channel and the DW2O channel used for the distinguishing of the (2) and (3).

Figure 4:
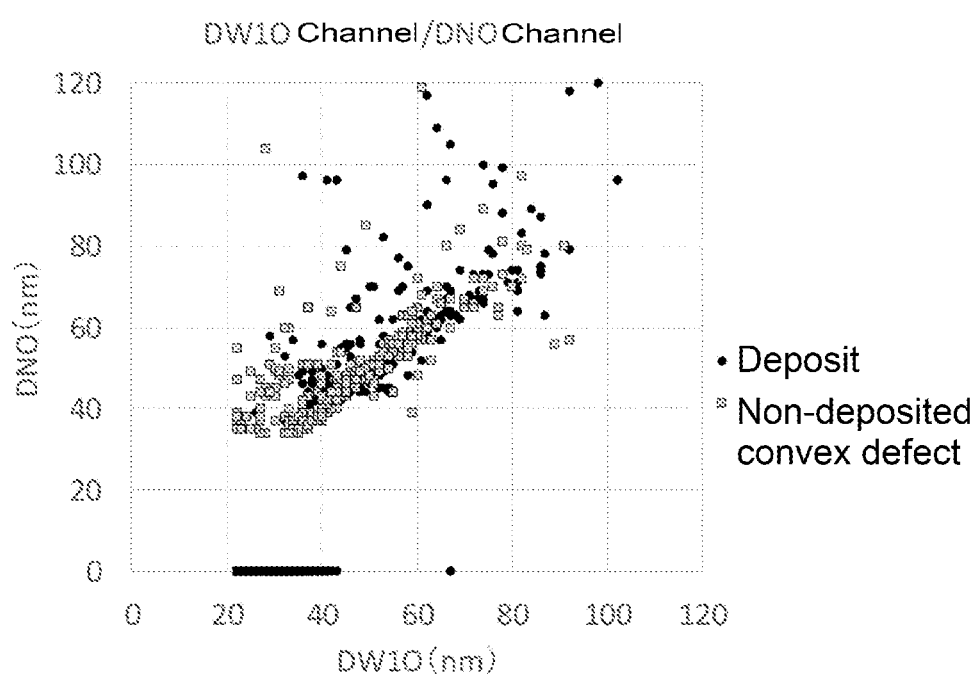
FIG. 4 is a graph showing the detection size distribution of the DW1O channel and the DNO channel used in distinguishing of (4) shown in Table 2 in Example.

FIG. 4 is a graph showing the detection size distribution of the DW1O channel and the DNO channel used for the distinguishing of the (4).

Figure 5:
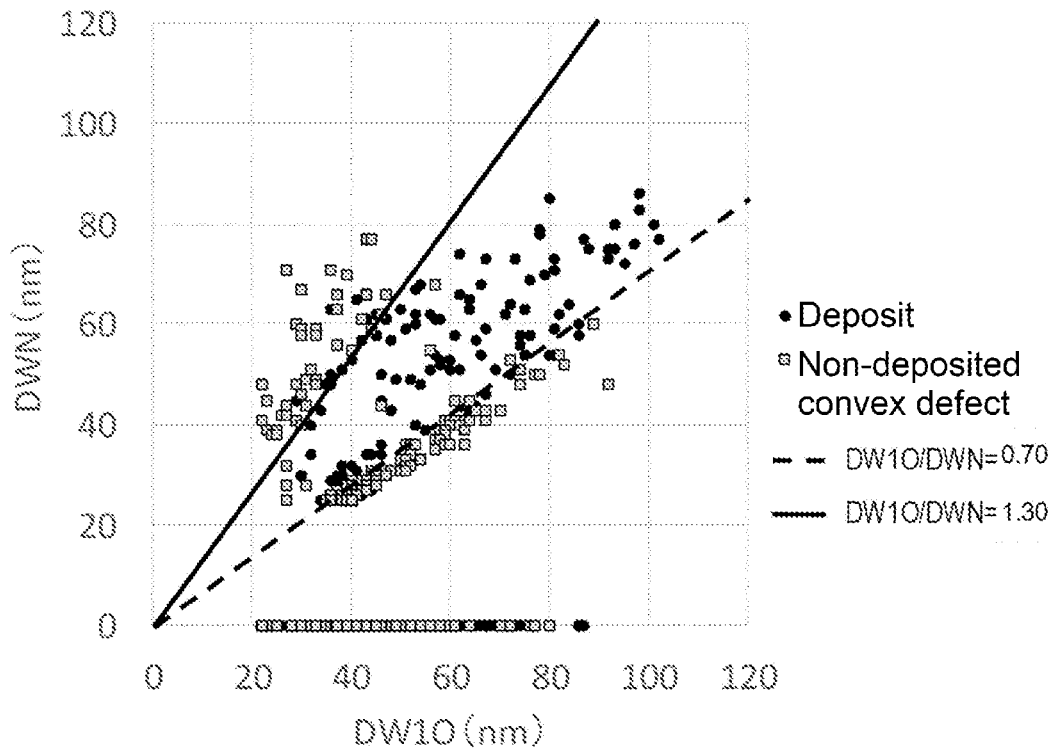
FIG. 5 is a graph showing the detection size distribution of the DW1O channel and the DWN channel used in distinguishing of (5) and (6) shown in Table 2 in Example.

FIG. 5 is a graph showing the detection size distribution of the DW1O channel and the DWN channel used for the distinguishing of (5) and (6).

Figure 6:
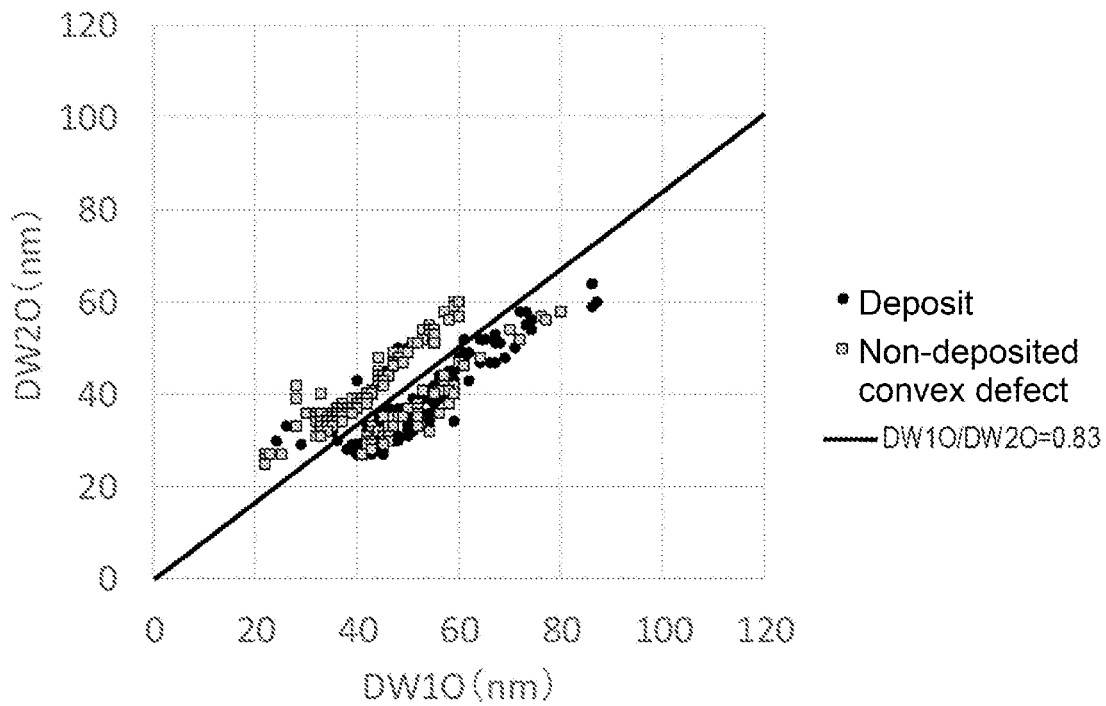
FIG. 6 is a graph showing the detection size distribution of the DW1O channel and the DW2O channel used in distinguishing of (7) shown in Table 2 in Example.

FIG. 6 is a graph showing the detection size distribution of the DW1O channel and the DW2O channel used for the distinguishing of (7).

The each of the above graphs also shows the classification results of the defect kinds by the SEM observation of the 2.

The classification results of the defect kinds thus obtained were compared with the SEM observation results of the 2, and the number of the defect kinds adapted to the distinguishing criteria was determined, and was found to be each value shown in Table 2. From the results, the probability that the distinguishing results by the distinguishing criteria shown in Table 2 were in agreement with the classification results by the SEM observation results, that is, the adaptation rate was calculated, and was found to be each value shown in Table 2. This confirmed that the defect kinds could be distinguished and evaluated with precision not depending upon the thickness of the coating layer.

TABLE 2

| Defect kind distinguishing criteria | Distinguishing | Number of defect kinds to be targeted | Number of defect kinds adapted to distinguishing criteria | Adaptation rate |
| --- | --- | --- | --- | --- |
| (1) Those with display size of DCO channel of 200,000 μm (i.e., those with detection size exceeding detection upper limit size in at least one of DW10 channel, DW20 channel, and DNO channel) | Deposit | 440 | 426 | 96.8% |
| (2) Those other than light point defects distinguished in defect kind at the (1), detected at DW10 channel, and not detected at DW20 channel | Deposit | 706 | 673 | 95.3% |
| (3) Those other than light point defects distinguished in defect kind at the (1) and (2), detected at DW20 channel, and not detected at DW10 channel | Non-deposited convex defect | 562 | 528 | 94.0% |
| (4) Those other than light point defects distinguished in defect kind at the (1) to (3), detected at DW10 channel, and not detected at DNO channel | Deposit | 566 | 496 | 87.6% |
| (5) Those other than light point defects distinguished in defect kind at the (1) to (4), having detection size at DW10 channel and detection size at DWN channel both of more than 0, and having detection size ratio satisfying any of DW10/DWN ≥ 1.30, and DW10/DWN ≤ 0.70 | Non-deposited convex defect | 614 | 552 | 89.9% |
| (6) Those other than light point defects distinguished in defect kind at the (1) to (4), having detection size at DW10 channel and detection size at DWN channel both of more than 0, and having detection size ratio satisfying 0.70 < DW10/DWN < 1.30 | Deposit | 123 | 104 | 84.6% |
| (7) Those other than light point defects distinguished in defect kind at the (1) to (6), having detection size at DW10 channel and detection size at DW20 channel both of more than 0, and having | Non-deposited convex defect | 235 | 204 | 86.8% |

TABLE 2-continued

| Defect kind distinguishing criteria | Distinguishing | Number of defect kinds to be targeted | Number of defect kinds adapted to distinguishing criteria | Adaptation rate |
|---|---|---|---|---|
| detection size ratio of detection size at DW10 channel and detection size at DW20 channel satisfying DW10/DW20 > 0.83 | | | | |
| (8) Those satisfying none of the (1) to (7) | Deposit | 198 | 146 | 73.7% |
| Total | — | 3444 | 3129 | 90.9% |

One aspect of the present invention is useful in the manufacturing field of a semiconductor wafer.

The invention claimed is:

1. A method of evaluating a semiconductor wafer by a laser surface inspection device,
wherein the semiconductor wafer comprises a coating layer on a semiconductor substrate,
the laser surface inspection device comprises:
a first incident system,
a second incident system making a light incident upon a surface to be irradiated at an incidence angle higher than an incidence angle of a light to be made incident upon the surface to be irradiated by the first incident system,
a first light receiving system,
a second light receiving system, and
a third light receiving system,
the three kinds of light receiving systems are different in one or more selected from the group consisting of a light-receiving angle at which a light radiated from the surface to be irradiated is received and polarization selectivity, respectively,
the method comprises:
performing evaluation of the semiconductor wafer by detecting a defect kind selected from the group consisting of a deposit and a non-deposited convex defect present on a surface of the coating layer as a light point defect based on a plurality of measurement results including three kinds of low incidence angle measurement results obtained by, on the surface of the coating layer, reception of a radiated light radiated by reflection or scattering of a light incident from the first incident system at the surface by the three kinds of light receiving systems, and at least one high incidence angle measurement result obtained by reception of a radiated light radiated by reflection or scattering of a light incident from the second incident system at the surface by at least one of the three kinds of light receiving systems, and
distinguishing whether the defect kind detected as the light point defect is a deposit or a non-deposited convex defect based on a distinguishing criterion selected from the group consisting of,
presence or absence of detection and a detection size in measurement result 1 obtained by the combination of the first incident system and the first light receiving system,
presence or absence of detection and a detection size in measurement result 2 obtained by the combination of the first incident system and the second light receiving system,
presence or absence of detection and a detection size in measurement result 3 obtained by the combination of the first incident system and the third light receiving system, and
presence or absence of detection and a detection size in measurement result 4 obtained by the combination of the second incident system and the second light receiving system or the third light receiving system,
wherein
the first light receiving system receives an omnidirectional light,
the second light receiving system selectively receives a polarized light at an azimuth angle $\theta_1°$,
the third light receiving system selectively receives a polarized light at an azimuth angle $\theta_2°$ different from the azimuth angle $\theta_1°$, where $0°\leq\theta_1°\leq90°$ and $90°\leq\theta_2°\leq180°$,
a light-receiving angle of the first light receiving system is a higher angle than a light-receiving angle of the second light receiving system and a light-receiving angle of the third light receiving system, and
wherein the distinguishing is performed according to the distinguishing criteria shown in Table 1 below, in Table 1, X, Y, and Z are each independently more than 0;

TABLE 1

| Distinguishing criteria | Defect kind |
|---|---|
| (1) Exceeding the detection upper limit size in at least one of measurement result 1, measurement result 2, and measurement result 3. | Deposit |
| (2) Other than the light point defect distinguished in terms of defect kind in the (1), detected in the measurement result 2, and not detected in the measurement result 3. | Deposit |
| (3) Other than the light point defect distinguished in terms of defect kind in the (1) or the (2), detected in the measurement result 3, and not detected in the measurement result 2. | Non-deposited convex defect |

TABLE 1-continued

| Distinguishing criteria | Defect kind |
|---|---|
| (4) Other than the light point defect distinguished in terms of defect kind in any of the (1) to (3), detected in the measurement result 2, and not detected in the measurement result 1 | Deposit |
| (5) Other than the light point defect distinguished in terms of defect kind in any of the (1) to (4), the detection size in the measurement result 4 and the detection size in the measurement result 2 being both more than 0, and the detection size ratio satisfying any of (detection size in measurement result 2)/(detection size in measurement result 4) > X, and (detection size in measurement result 2)/(measured size in measurement result 4) < Y. | Non-deposited convex defect |
| (6) Other than the light point defect distinguished in terms of defect kind in any of the (1) to (4), the detection size in the measurement result 4 and the detection size in the measurement result 2 both being more than 0, and the detection size ratio satisfying Y < (detection size in measurement result 2)/(detection size in measurement result 4) < X. | Deposit |
| (7) Other than the light point defect distinguished in terms of defect kind in any of the (1) to (6), the detection size in the measurement result 2 and the detection size in the measurement result 3 both being more than 0, and the size ratio of detection size in measurement result 2 and detection size in measurement result 3 satisfying (detection size in measurement result 2)/(detection size in measurement result 3) > Z. | Non-deposited convex defect |
| (8) Other than the light point defects distinguished in terms of defect kind in the (1) to (7). | Deposit |

2. The method of evaluating a semiconductor wafer according to claim 1,
wherein X falls within a range of 1.30 to 1.50, Y falls within a range of 0.60 to 0.80, and Z falls within a range of 0.80 to 0.85.

3. The method of evaluating a semiconductor wafer according to claim 1,
wherein the coating layer is a deposition layer comprising deposition materials deposited therein.

4. The method of evaluating a semiconductor wafer according to claim 1,
wherein the semiconductor substrate is a single crystal silicon substrate.

\* \* \* \* \*